United States Patent
Koshiishi et al.

(10) Patent No.: US 7,944,026 B2
(45) Date of Patent: May 17, 2011

(54) SEMICONDUCTOR DEVICE

(75) Inventors: Kazutaka Koshiishi, Tokyo (JP); Mitsuaki Katagiri, Tokyo (JP); Satoshi Isa, Tokyo (JP); Haruo Akahoshi, Ibaraki (JP)

(73) Assignee: Elpida Memory, Inc., Tokyo (JP)

( * ) Notice: Subject to any disclaimer, the term of this patent is extended or adjusted under 35 U.S.C. 154(b) by 589 days.

(21) Appl. No.: 11/962,142

(22) Filed: Dec. 21, 2007

(65) Prior Publication Data
US 2008/0164585 A1    Jul. 10, 2008

(30) Foreign Application Priority Data

Dec. 22, 2006  (JP) .................... 2006-345590

(51) Int. Cl.
*H01L 29/40*   (2006.01)

(52) U.S. Cl. . 257/664; 257/736; 257/781; 257/E23.012; 257/E23.039; 257/E23.144

(58) Field of Classification Search .......... 257/664, 257/677, 735, 736, 762, 781, E23.012, E23.014, 257/E23.019, E23.039, E23.142, E23.144
See application file for complete search history.

(56) References Cited

FOREIGN PATENT DOCUMENTS

| JP | 9-186509 | 7/1997 |
|---|---|---|
| JP | 2006-13553 | 1/2006 |
| JP | 2006013553 A * | 1/2006 |

OTHER PUBLICATIONS

Machine Translation of JP 2006-13553 A. The Original Japanese reference is not being furnished with this Office Action since the original reference was supplied by the applicant in an IDS.*
Japanese Patent Office issued a Japanese Office Action on Oct. 22, 2008, Application No. 2006-345590.

* cited by examiner

*Primary Examiner* — Matthew E Warren
(74) *Attorney, Agent, or Firm* — Young & Thompson

(57) ABSTRACT

A semiconductor device is mounted on a package substrate which has a power supply line and a signal line formed of a normal or predetermined resistance material layer on a dielectric layer. A resistance material layer has a high resistance as compared with the normal resistance material layer and is additionally provided on the surface of the normal resistance material layer of the peripheral face of the signal line closest to the power supply line.

13 Claims, 10 Drawing Sheets

SEMICONDUCTOR DEVICE

This application is based upon and claims the benefits of priority from Japanese patent application No. 2006-345590, filed on Dec. 22, 2006, the disclosure of which is incorporated herein in its entirety by reference.

BACKGROUND OF THE INVENTION

1. Field of the Invention

The present invention relates to a semiconductor device, and in particular, to a semiconductor device mounted on a package substrate capable of reducing signal noises.

2. Description of the Related Art

In recent years, the operational speed of semiconductor devices has been increased on one hand, while their power consumption has been reduced on the other hand. This leads to various problems which need not be addressed according to prior arts. The problems include those relating to signal integrity (SI) and power integrity (PI). The SI relates to a transmission waveform quality during signal transmission in a semiconductor device. The SI ensures digital signals having wide frequency components are transmitted without deterioration and with the transmission waveform quality being kept high. The PI relates to high-voltage (VDD) and low-voltage (ground) power supply quality. When the power supply is not stable, it will cause insufficient power supply to a transmission circuit connected to the power supply, which will in turn cause variation in power supply voltage, disturbance in signal waveform, and radiation noises, resulting in deterioration of the signal waveform.

The signal deterioration is caused by various factors, including, inter alia, noises caused by high-speed signals. Referring to FIG. 1 description will be made of deteriorated signal waveforms and causes thereof. FIG. 1A depicts an ideal signal waveform 1. The signal waveform 1 takes a form of a rectangular wave which has a low-level portion, a rising portion, a high level portion, and a failing portion shown by straight lines. This waveform is put in ideal conditions for all factors including stability in power supply voltage.

However, as the operational speed of the semiconductor device is increased and the signal speed is increased, disturbance in actual signal waveforms becomes more notable. The signal waveform is susceptible to the noise due to ringing (multiple reflection caused by impedance mismatching possibly occurring during connection of transmission lines or components), overshoot or undershoot. As shown in FIG. 1C, the resulting waveform includes an overshoot 3 and an undershoot 4. The overshoot 3 and the undershoot 4 are generated when rising and falling portions of a signal output by a driver momentarily exceed a fixed high/low level. Accordingly, in practice, measures are taken so that the overshoot 3 and the undershoot 4 are minimized in an actual signal waveform 2 as shown in FIG. 1B.

In addition, power supplies have problems such as a simultaneous switching noise. The simultaneous switching noise will be described with reference to FIG. 2. The reference numeral 5 denotes a high-voltage power supply line (VDD), 6 denotes a low-voltage ground line (VSS), 7 denotes a current path occurring during operation, and 8 denotes a transistor. When all the transistors 8 are simultaneously switched over, a current will be fed to all the current paths 7-1 to 7-N simultaneously. This means that the current path 7 should supply the current to all of the current paths 7-1 to 7-N.

Consequently, a large current flows through the power supply line 5, which increases the electromotive force and results in noise generation. This is so-called simultaneous switching noise. Such problem has been addressed by using a multilayer substrate for enlarging the area of power supply and ground lines, or by mounting by-pass capacitors and damping resistors, or by performing impedance matching. However, the increased speed, the reduced size and the increased density of the semiconductor device have made it difficult to enlarge the area of the power supply and ground lines or to arrange a sufficient number of by-pass capacitors or damping resistors. This causes problems of disturbance in the signal waveform and deterioration of the signal quality.

Some prior art patent documents refer to deterioration of signal waveform as described below. Japanese Laid-Open Patent Publication No. 2003-283148 (Patent Document 1) describes a multilayer wiring board in which a power supply layer and a ground layer are formed by a laminate structure consisting of a low-resistance conductor layer and a high-resistance conductor layer. Both the power supply layer and the ground layer have a high-resistance conductor layer on their surfaces facing each other so that the variation in power supply voltage or the radiation noise possibly occurring in the power supply layer or the ground layer is thereby suppressed. Japanese Laid-Open Patent Publication No. 2003-234429 (Patent Document 2) describes a chip size package (CSP) having a semiconductor chip mounted thereon, in which a coating layer of a high-resistance metal material is provided on one surface of a wiring pattern for connection between the semiconductor chip and a bump electrode.

Japanese Laid-Open Patent Publication No. 2003-332735 (Patent Document 3) describes a technique in which there are provided patterns having a high resistivity and isolated from each other (referred to as anchor portions) on a part of the wiring pattern surface in contact with an insulating layer of a wiring board. Japanese Laid-Open Patent Publication No. 2004-087928 (Patent Document 4) describes a technique in which the mutually facing surfaces of wiring conductor layers transmitting high-frequency signals are formed by a main conductor layer having a surface resistance not more than 1.5 times the surface resistance caused by the skin effect. Japanese Laid-Open Patent Publication No. 2004-327745 (Patent Document 5) describes a wiring board in which a high-resistance layer provided on the surface of a wiring pattern for the purpose of preventing oxidation is formed to have a thickness of 1 μm or less, or no high-resistance layer is formed.

SUMMARY OF THE INVENTION

As described above, the recent increase of operational speed and reduction of power consumption of the semiconductor devices involves increase of unwanted effects exerted on signal transmission by noises generated by high-speed signals on a packaging board or package substrate. The noises generated by high-speed signals include ringing, and overshoot and undershoot noises. These noises have conventionally been dealt with, for example, by arranging a damping resistor on a substrate or by performing impedance matching. However, the increased operational speed, decreased size, and increased density of the semiconductor devices have make it impossible to enlarge the area of power supply and ground lines, or to arrange a sufficient number of bypass capacitors and damping resistors. This results in problems of occurrence of disturbance in the signal waveform, and deterioration of the signal quality.

Herein, it is to be noted that none of the above-mentioned art patent documents mentions or suggests the above-mentioned problems that would be caused to occur from the disturbance in the signal waveform and the deterioration of the signal quality.

In view of the problems as described above, it is an exemplary object of the present invention to provide a semiconductor device with a package substrate capable of suppressing the disturbance in the signal waveform and ensuring high signal quality.

A semiconductor device according to the present invention is mounted on a package substrate. The package substrate includes a dielectric layer, and a power supply line and a signal line both of which are formed on the dielectric layer by a predetermined resistance material layer. A high resistance material layer is further provided on the surface of the predetermined resistance material layer of the peripheral face of the signal line closest to the power supply line. The high resistance material layer has a high resistance as compared with the predetermined resistance material layer.

The semiconductor device according to the present invention has a semiconductor chip mounted on the package substrate, and the package substrate wiring is composed of the predetermined or normal resistance material layer and the high resistance material layer which has the high resistance as compared with the predetermined resistance material layer. Most part of noise current of a high-speed operation signal transmitted through the wiring pattern of the package board or package substrate is composed of high frequency components. Signal noises such as overshoot, undershoot and ringing are generated by the increase of signal frequency. The use of a high resistance material layer on the face of the signal line facing the power supply line is effective to efficiently reduce the signal noises such as overshoot, undershoot, and ringing. Further, the high resistance material layer can be applied to between the signal line and the power supply plane in a reduced-size tape carrier package substrate to obtain a more enhanced noise reduction effect.

DETAILED DESCRIPTION OF THE INVENTION

Preferred exemplary embodiments of a semiconductor device according to the present invention will be described with reference to the accompanying drawings.

First Exemplary Embodiment

Figure 1A:
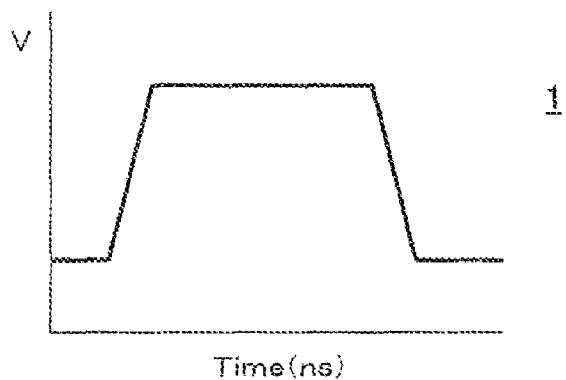
FIGS. 1A, 1B and 1C are waveform diagrams of high-speed signals.
Figure 1B:
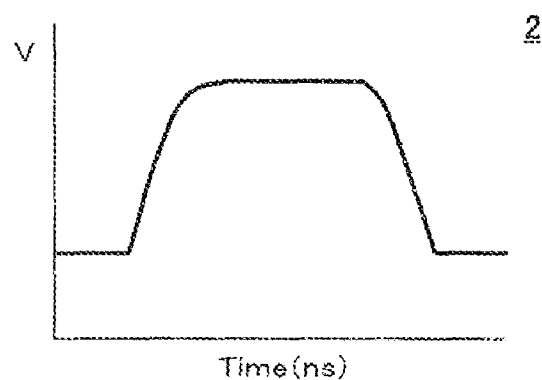
Figure 1C:
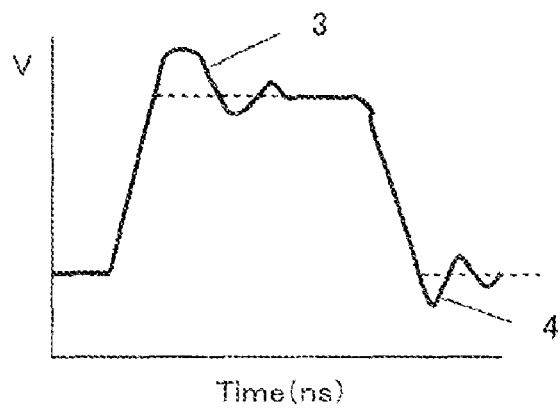
Figure 2:
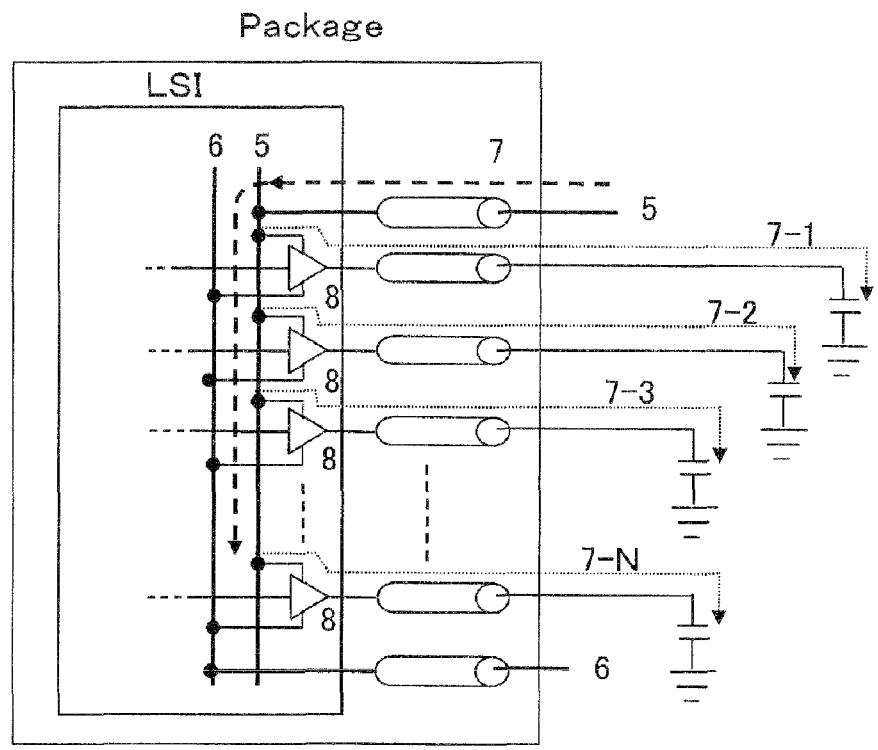
FIG. 2 is an explanatory diagram for explaining a simultaneous switching noise.
Figure 3:
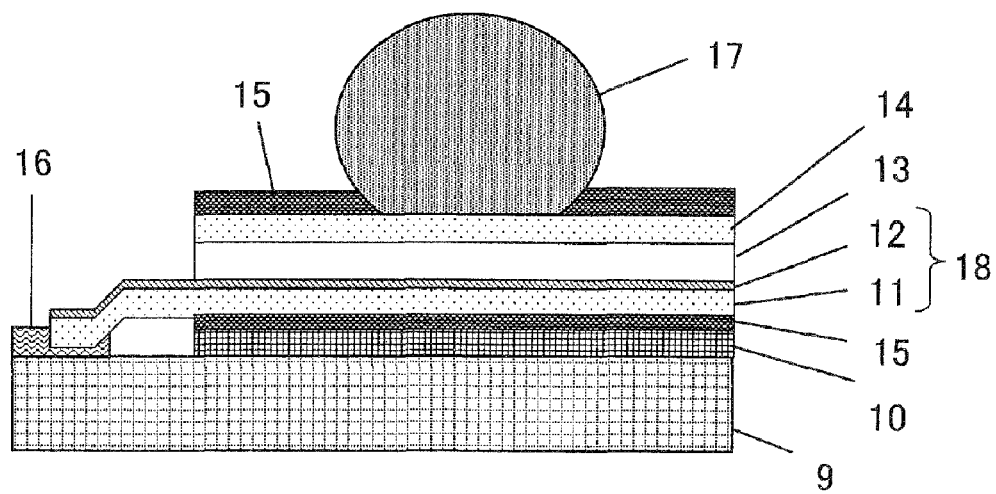
FIG. 3 is a cross-sectional view showing a semiconductor device using a two-layer metal wiring board according to a first exemplary embodiment.
Figure 6A:
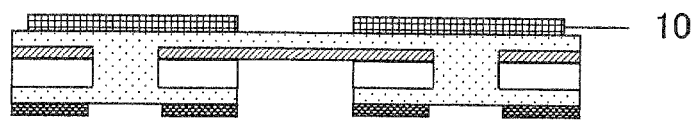
FIG. 6A is a cross-sectional view of the semiconductor device.
Figure 6B:
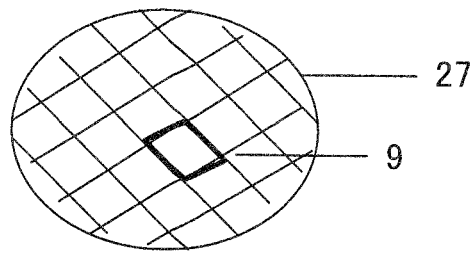
FIG. 6B is a plan view of a wafer.
Figure 6C:
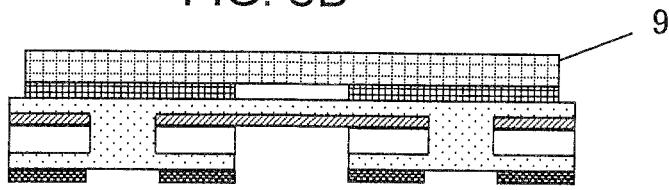
FIGS. 6C to 6F are cross-sectional views of the semiconductor device, showing respective assembling steps according to the first exemplary embodiment.
Figure 6D:
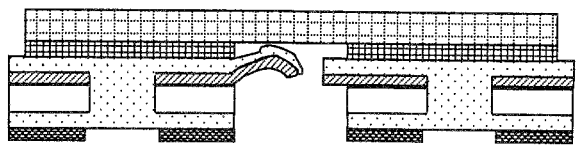
Figure 6E:
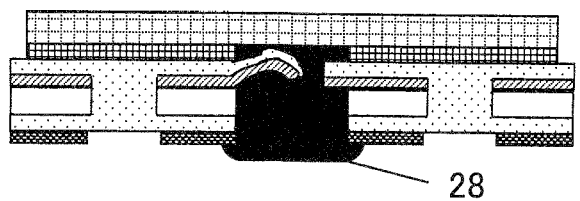
Figure 6F:
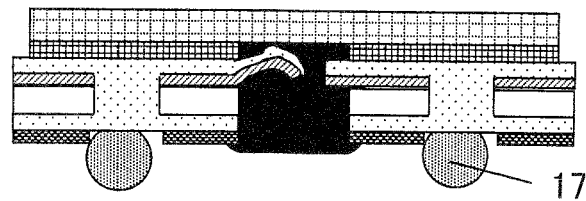
Figure 7:
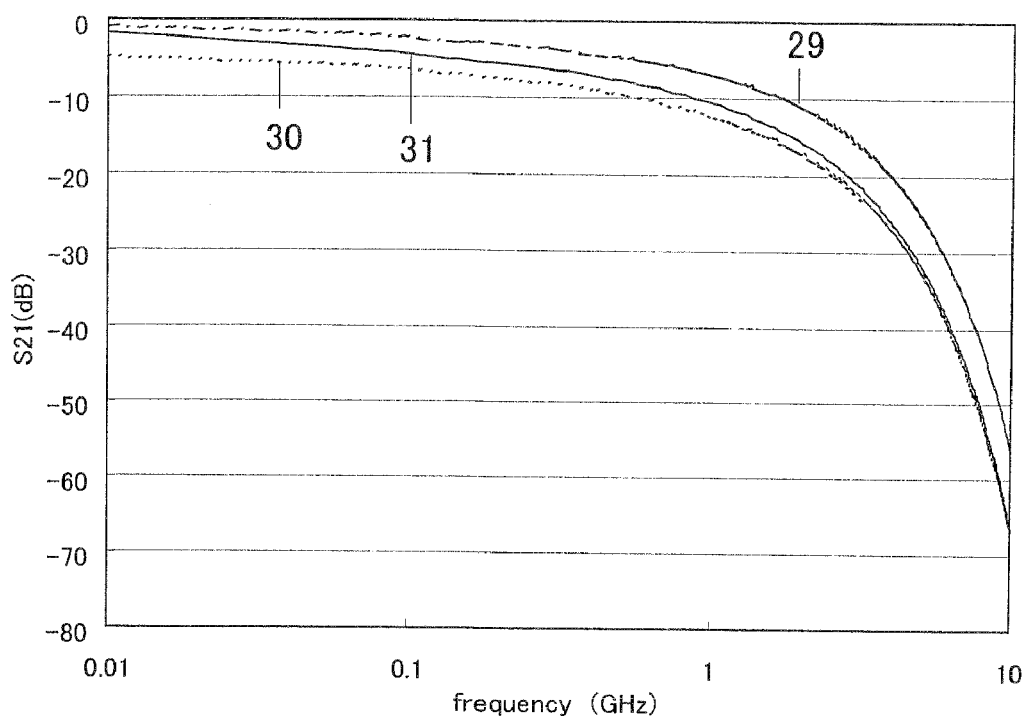
FIG. 7 is a graph showing transmission loss S21 relative to signal frequency according to the first exemplary embodiment.
Figure 8:
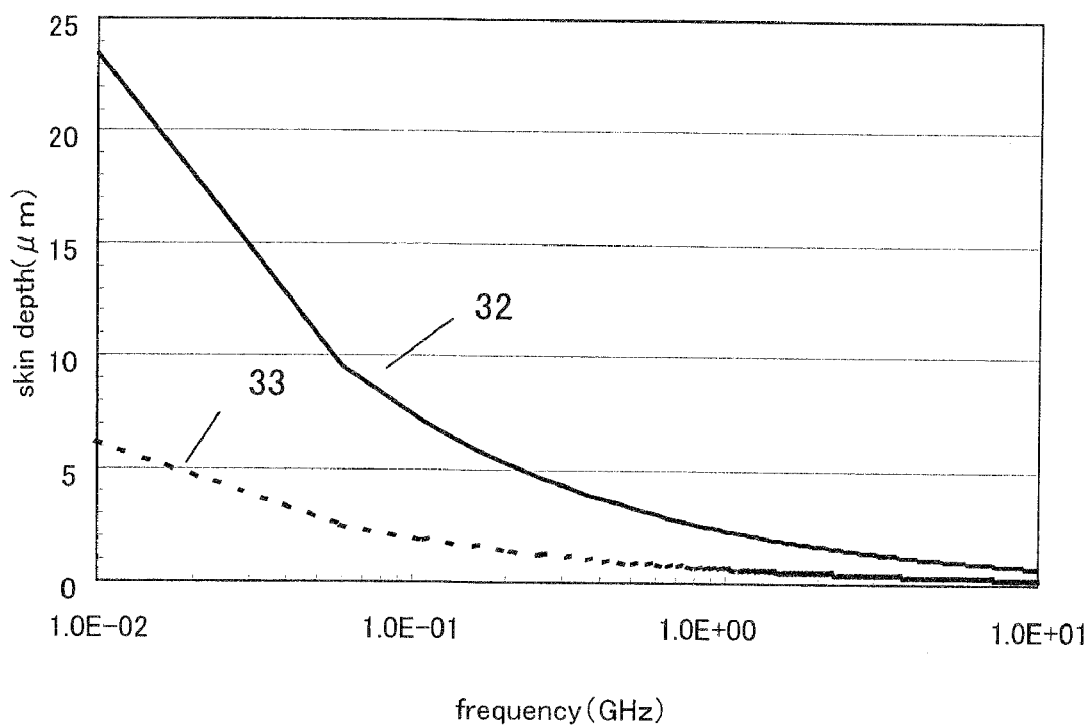
FIG. 8 is a graph showing skin depth (depth at which current flows) relative to signal frequency according to the first exemplary embodiment.

A semiconductor device according to first exemplary embodiment of the present invention will be described in detail with reference to FIGS. 3 to 8. FIG. 3 is a cross-sectional view showing a semiconductor device mounted on a two-layer wiring package substrate. FIGS. 4 to 6 are cross-sectional views or a plan view showing the respective manufacturing steps of the semiconductor device. FIG. 7 is a graph illustrating transmission loss between signal lines and a ground plane. FIG. 8 is a graph illustrating skin depth (depth at which current flows) depending on wiring materials of the package substrate.

FIG. 3 is a cross-sectional view of a semiconductor device according to the first exemplary embodiment of the present invention. The reference numeral 9 denotes a semiconductor chip, 10 denotes an elastomer, 11 denotes a predetermined resistance material layer. Herein, the predetermined resistance material layer may be, for example, a copper (Cu) layer which has a thickness of 12 to 16 μm and may be called a normal resistance material layer. The illustrated normal resistance material layer serves as a signal line. In addition, 12 denotes a high resistance material layer and has a thickness of 4 to 8 μm and a high resistance as compared with the normal resistance material layer and serves as the signal line. Moreover, 13 denotes a dielectric layer (of polyimide with a thickness of 50 μm) on the signal line, 14 denotes a ground plane (of Cu with a thickness of 20 μm), 15 denotes a solder resist on the ground plane, 16 denotes an Al pad (bonding pad) on the semiconductor chip, 17 denotes a solder ball (with a thickness of 350 μm), and 18 denotes the signal line consisting of the normal resistance material layer 11 and the high resistance material layer 12.

The package substrate is formed by using an organic material as a base material (e.g. the polyimide layer 13), and provided with two-layer wiring consisting of the signal line 18 and the ground plane 14. The signal line 18 is composed of the normal resistance material layer 11 and the high resistance material layer 12. As mentioned before, the normal resistance material layer 11 is made of a low resistance material such as copper (hereafter, represented as Cu), which is a commonly used wiring material having a low resistance. The high resistance material layer 12 is made of a metal material having a higher resistance than Cu, for example of Omega-Ply RCM (trade name of Ni—P alloy manufactured by Omega Technology Corp.) or 42 alloy. The semiconductor chip 9 and the package substrate are bonded to each other by means of the elastomer 10. The signal line 18 is pressure bonded to the bonding pad 16 of the semiconductor chip, and externally connected via the solder ball 17 of the package substrate.

Figure 4A:
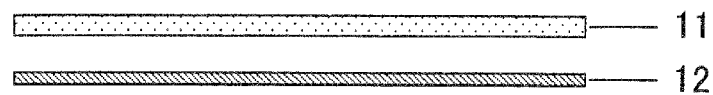
FIGS. 4A to 4G are cross-sectional views respectively showing manufacturing steps of a two-layer wiring package substrate according to the first exemplary embodiment.
Figure 4B:
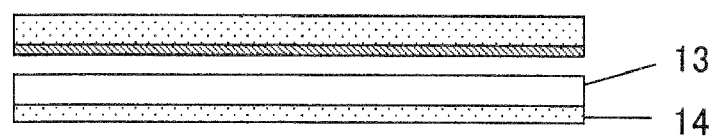
Figure 4C:
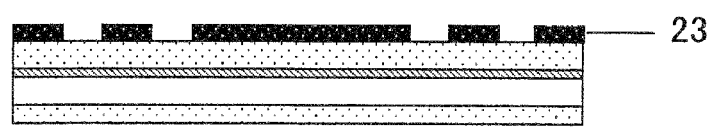
Figure 4D:
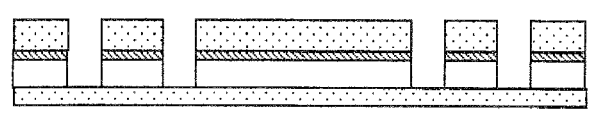
Figure 4E:
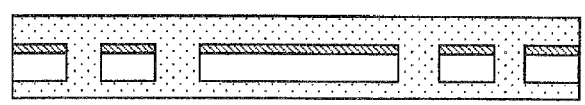
Figure 4F:
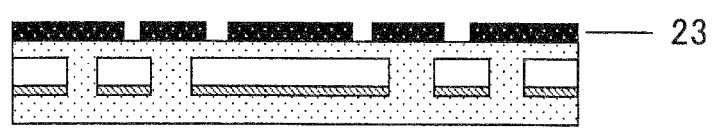
Figure 4G:
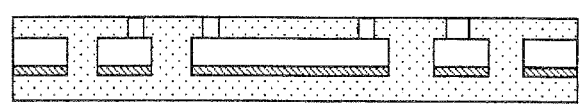

A manufacturing method of the semiconductor device according to the present invention will be described with reference to FIGS. 4 to 6. In the first step, as shown in FIG. 4A, a copper foil serving as the normal resistance material layer 11 is bonded to a material foil serving as the high resistance material layer 12 for forming the signal lines. This structure is then bonded to a base material (polyimide) 13 coated with a copper foil serving as the ground plane 14(FIG. 4B). A photoresist 23 is applied to the surface of the structure thus obtained and patterned (FIG. 4C). Via holes are formed by laser beam machining (FIG. 4D). The via holes are filled with Cu by a plating method to provide vias (FIG. 4E). The package substrate thus obtained is turned over and the photoresist 23 is applied to the copper foil serving as the ground plane 14 and patterned (FIG. 4F). Patterns are formed by etching (FIG. 4G).

Figure 5A:
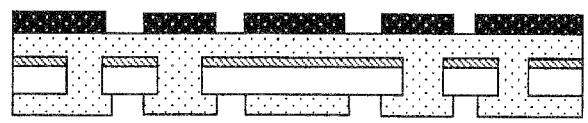
FIGS. 5A to 5E are cross-sectional views respectively showing manufacturing steps of the two-layer wiring package substrate according to the first exemplary embodiment and FIG. 5F is an overall plan view thereof.
Figure 5B:
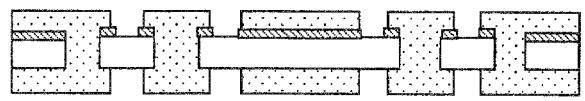
Figure 5C:
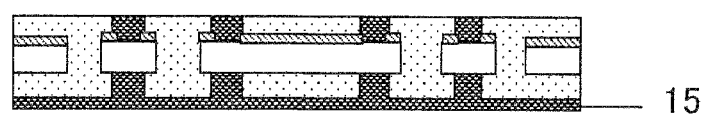
Figure 5D:
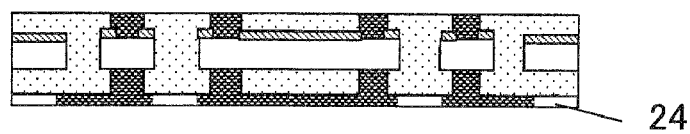
Figure 5E:
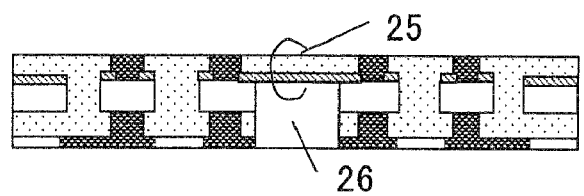

The package substrate is turned over and the photoresist 23 is applied to the upper face of the substrate and patterned (FIG. 5A). Patterns are formed by etching (FIG. 5B). A solder resist 15 is formed on the rear face of the substrate and within the etched holes (FIG. 5C). The solder resist is then removed from the regions corresponding to lands 24 (FIG. 5D). A bonding region 26 for the bonding purpose is opened while leaving bonding leads 25 intact (FIG. 5E). The bonding leads 25 are formed in a similar manner to the signal lines, and pressure bonded to bonding pad 16 of the semiconductor chip 9. The package substrate is completed by the steps described up here.

Figure 5F:
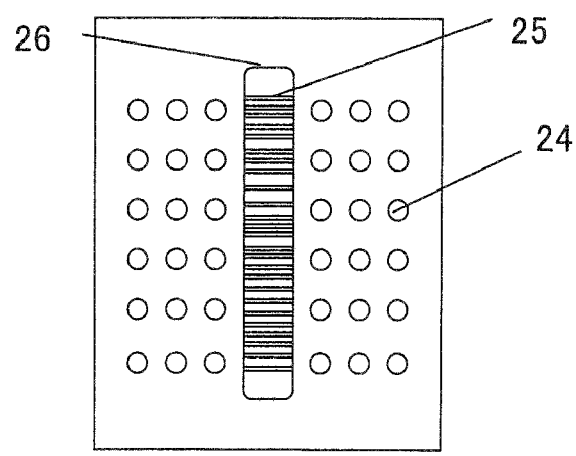

FIG. 5F is a plan view of the package substrate as viewed from the rear side. Although FIGS. 4 and 5 show only one package substrate, these package substrates are in practice combined to form a tape substrate. The lands 24 are arranged on the rear face of the package substrate so as to form solder balls thereon. The bonding region 26 for the bonding purpose is opened in a central portion of the substrate, and the bonding leads 25 are pressure bonded to the bonding pad 16. Although the present exemplary embodiment employs a semiconductor chip having a bonding pad in a central portion of the semiconductor chip, the present invention is not particularly limited to this. The bonding leads 25 and the bonding region 26 may be formed at any position corresponding to that of the bonding pad of the semiconductor chip.

A packaging step of a semiconductor device will now be described. An elastomer 10 is attached to the upper face of the package substrate (FIG. 6A). A semiconductor chip 9 is cut out from a semiconductor wafer 27 having a circuit formed thereon (FIG. 6B). The cut-out semiconductor chip 9 is bonded to the package substrate by means of the elastomer 10 (FIG. 6C). The bonding leads 25 are bonded to the bonding pad on the semiconductor chip (FIG. 6D). The bonding leads 25 each have a tapered part to facilitate the cutting thereof, and the bonding leads 25 are cut off at their tapered parts by impact force applied during the bonding process. The bonding portion is filled with a mold resin 28 (FIG. 6E). Solder balls 17 are mounted on the lands 24 (FIG. 6F). The semiconductor device is completed here. The semiconductor device may be sealed with the mold resin in its entirety, or may be sealed in various manners depending on intended final products.

FIG. 7 is a graph illustrating transmission loss between the signal lines and the ground plane. The graph of FIG. 7 was prepared by using an electromagnetic field simulation, while the signal lines, the dielectric material, and the ground plane of FIG. 3 were simply modeled. Air was used as analytic space, and the boundary condition was dealt with as a completely conducting surface (conductivity ∞). The simulator used was a high-frequency three-dimensional electromagnetic field simulator HFSS manufactured by ANSOFT, and analysis was conducted on a frequency range from 50 MHz to 10 GHz.

The line 29 in FIG. 7 represents an S21 waveform when the entire signal lines are formed of Cu (with an electric conductivity of $5.8 \times 10^7$ (Siemens/m) and a magnetic permeability of 1 (H/m)). The line 30 represents an S21 waveform when the entire signal lines are formed of Ni (with an electric conductivity of $1.4 \times 10^6$ (Siemens/m) and a magnetic permeability of 600 (H/m)). The line 31 represents an S21 waveform when the high resistance material layer 12 of FIG. 3 is formed of Ni (with an electric conductivity of $1.4 \times 10^6$ (Siemens/m) and a magnetic permeability of 600 (H/m)) and the normal resistance material layer 11 is formed of Cu (with an electric conductivity of $5.8 \times 10^7$ (Siemens/m) and a magnetic permeability of 1 (H/m)) As seen from FIG. 7 the combination of Cu and Ni exhibits an attenuation close to that of Cu only (line 29) in the vicinity of a low frequency (10 MHz), whereas in the vicinity of high frequency (1 GHz or higher) it exhibits an attenuation close to that of Ni only (line 30). This is because more current is caused to flow through the high resistance material layer at a high frequency due to the skin effect.

Differences in the skin depth (the depth at which current flows) depending on wiring materials will be described with reference to FIG. 8. The line 32 in FIG. 8 represents a skin depth of Cu, and the line 33 represents a skin depth of Ni. It can be seen that even in the case of Cu, the skin depth is 10 μm or less when the frequency exceeds 60 MHz. It is believed therefore that in the case of the combination of Cu and Ni, the current mostly flows through the Ni portion. Accordingly, the combination of Cu and Ni exhibits attenuation close to that of Cu in low frequencies but exhibits attenuation close to that of Ni at high frequencies.

Noises are mainly composed of an operating frequency component and its harmonic component, and contain more high frequency components. The operating frequency component and frequency components lower than that form a signal itself. Therefore, the signal noises can be reduced by reducing the attenuation of the low frequency components of the signal while increasing the attenuation of the high frequency components. This can be achieved by the semiconductor device of the present invention which has a low attenuation at low frequencies and a high attenuation at high frequencies. Further, current is apt to flow through a wiring portion closer to the ground (proximity effect). This effect becomes more prominent as the distance between the signal lines and the ground plane becomes smaller. Accordingly, a greater noise reduction effect can be obtained by applying this proximity effect to between the signal lines and the ground plane in a tape carrier package substrate of a chip size package (CSP) having a reduced size.

In the semiconductor device according to the first exemplary embodiment, each signal line on the package substrate has a two-layer structure consisting of a normal resistance material layer and a high resistance material layer. The high resistance material layer is formed on an outer peripheral surface of the signal line close to the ground plane. Thus, the high resistance material layer is formed on the surface close to the ground plane whereby the attenuation of the high frequency components flowing due to the skin effect and the proximity effect is achieved and the high frequency noises are reduced. Accordingly, the signal line itself has a signal noise reduction effect like a damping resistor. The reduction of the high frequency noises makes it possible to provide a semiconductor device having a reduced size, higher density and increased operational speed.

Second Exemplary Embodiment

Figure 9:
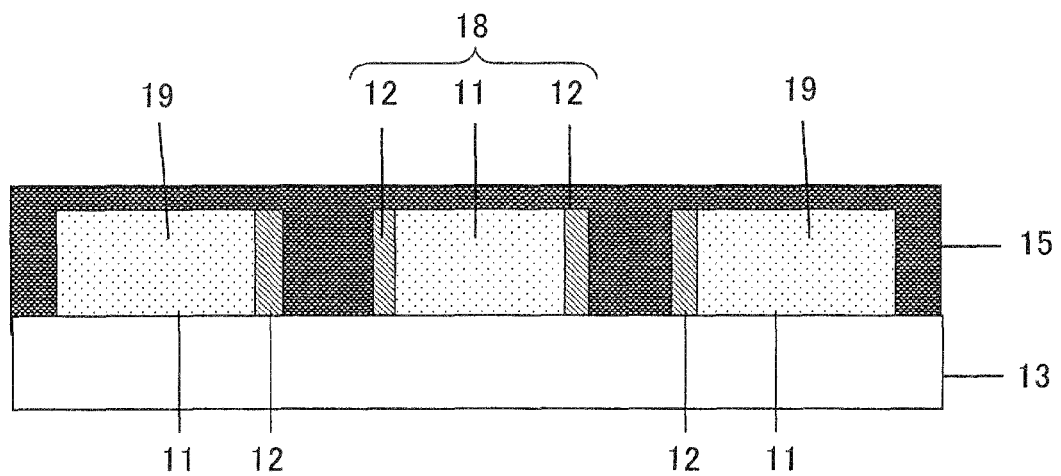
FIG. 9 is a cross-sectional view of a first single-layer wiring package substrate according to a second exemplary embodiment.
Figure 10:
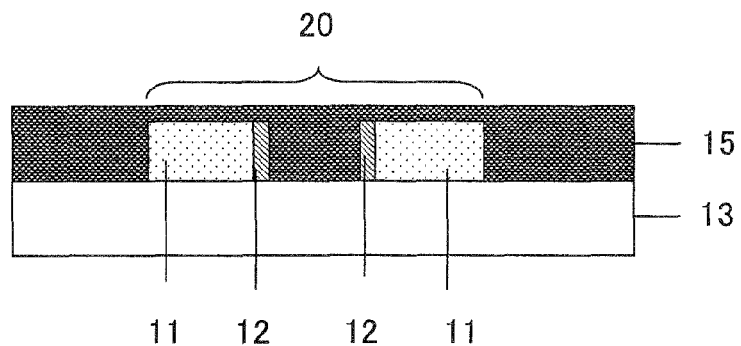
FIG. 10 is a cross-sectional view of a second single-layer wiring package substrate according to the second exemplary embodiment.
Figure 11:
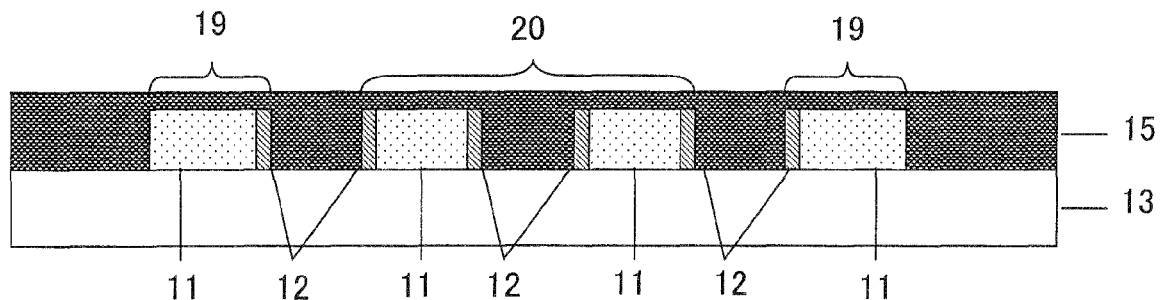
FIG. 11 is a cross-sectional view of a third single-layer wiring package substrate according to the second exemplary embodiment.
Figure 13A:
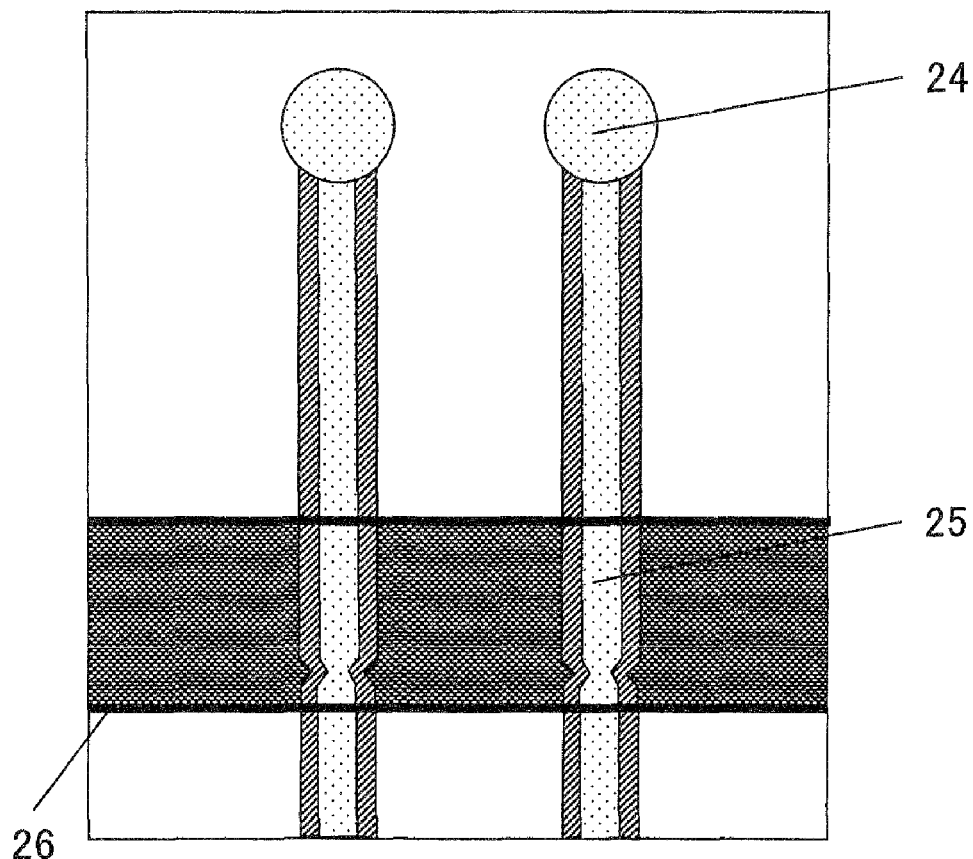
FIG. 13A is a partially enlarged plan view and FIG. 13B is an overall plan view showing the single-layer wiring package substrate during manufacturing steps according to the second exemplary embodiment.
Figure 13B:
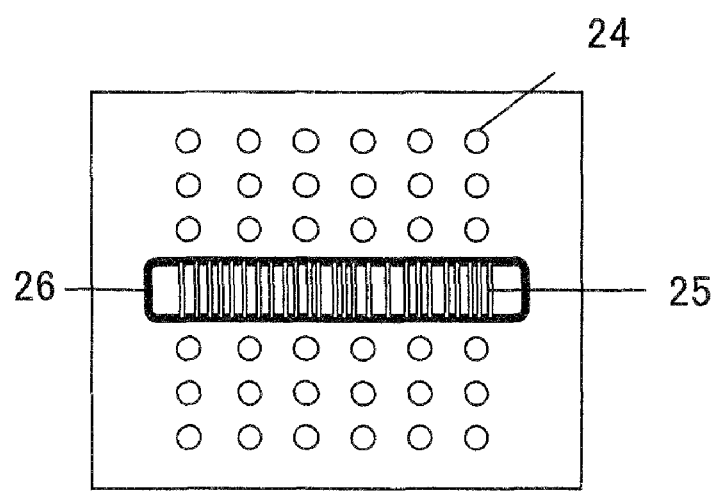
Figure 14:
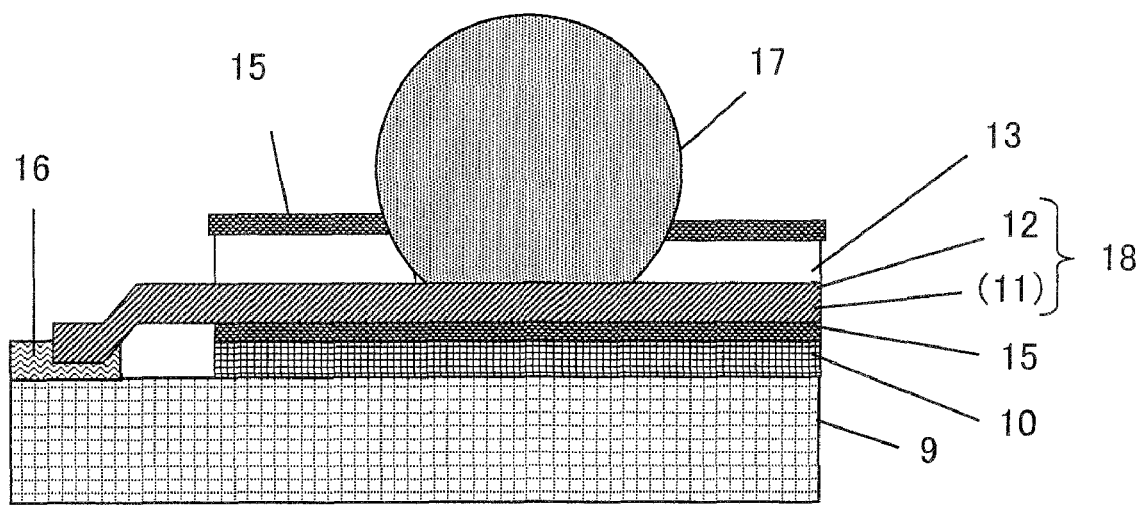
FIG. 14 is a cross-sectional view of a semiconductor device using the single-layer wiring package substrate according to the second exemplary embodiment.

A semiconductor device according to a second exemplary embodiment of the present invention will be described with reference to FIGS. 9 to 14. The second exemplary embodiment relates to a semiconductor device mounted on a single-layer wiring package substrate in which a high resistance material layer is provided only on a required side face or faces of each signal line. FIG. 9 is a cross-sectional view showing a package substrate in which a high resistance material layer is formed on the both side faces of a signal line. FIG. 10 is a cross-sectional view showing a package substrate in which a high resistance material layer is formed on the mutually facing side faces of adjacent differential signal lines. FIG. 11 is a cross-sectional view showing a package substrate in which differential signal lines are arranged between two ground lines, and a high resistance material layer is formed on the both side faces of the differential signal lines and on the side faces of the ground lines adjacent and facing the differential signal lines. FIGS. 12A to 12E are cross-sectional views illustrating respective manufacturing steps of a single-layer wiring package substrate FIGS. 13A and 13B are plan views of the single-layer wiring package substrate FIG. 14 is a cross-sectional view of a semiconductor device mounted on the single-layer wiring package substrate.

FIGS. 9 to 11 illustrate the package substrate, in a simplified manner, in which metal lines have been formed and a solder resist has been applied. In the second exemplary embodiment as well, the normal or predetermined resistance material layer 11 is formed of a commonly used low-resistance wiring material such as Cu. The high resistance material layer 12 is formed of a metal material having a higher resistance than Cu, for example Omega-Ply RCM (trade name of Ni—P alloy manufactured by Omega Technology Corp.) or 42 Alloy.

The single-layer wiring package substrate shown in FIG. 9 has a signal line 18 arranged between two ground lines 19 on the same plane. The ground lines 19 and the signal line 18 are arranged on a polyimide layer 13 serving as a base material. The entire substrate surface including the wiring lines is covered with a solder resist 15. The signal line 18 and the ground lines 19 are each composed of the normal resistance material layer 11 and the high resistance material layer 12 formed on the side face(s) thereof. When the signal line 18 is thus interposed between the ground lines 19 on the same plane, the peripheral surfaces of the signal line 18 closest to the ground lines 19 are the side faces of the signal line 18. Accordingly, the high resistance material layer is formed on the side face of each ground line 19 and the side face of the signal line 18 adjacent and facing each other. The formation of the high resistance material layer on the side faces of the signal line makes it possible to reduce the signal noises under the influence of the proximity effect. When the wiring lines are laid in this manner, the effect of the high resistance material layers provided on the opposite side faces of the signal line 18 is enhanced so much that the high resistance material layers on the side faces of the ground lines 19 can even be omitted.

FIG. 10 shows another exemplary embodiment example of a single-layer wiring package substrate, in which a pair of differential signal lines 20 is placed on the same plane and arranged on a polyimide layer 13 serving as a base material. Each differential signal line 20 is composed of a normal resistance material layer 11 and a high resistance material layer 12. The high resistance material layer 12 is arranged on the adjacent and mutually facing side faces of the differential signal lines 20. The electric field coupling between differential signals is strong when the differential signal lines are used. Therefore, the formation of the high resistance material layer on the adjacent and mutually facing surfaces of the differential signal lines makes it possible to reduce the noise components between the differential signals by means of the high resistance material layer.

FIG. 11 shows still another exemplary embodiment example of a single-layer wiring package substrate. A pair of differential signal lines 20 is arranged between two ground lines 19 on a polyimide layer 13 serving as a base material. A high resistance material layer 12 is provided on the adjacent and mutually facing side faces of the differential signal lines 20. Further, since the ground lines 19 are present adjacent to the differential signal lines 20, the high resistance material layer 12 is also provided on the adjacent and mutually facing side faces of the differential signal lines 20 and the ground lines 19. This means that the high resistance material layer 12 is provided on both side faces of each of the differential signal lines 20. Return current flowing through the ground line 19 will flow along the surface close to the signal line 20 due to the proximity effect. Therefore, the provision of the high resistance material layer 12 on the side face of each ground line 19 facing the differential signal line makes it possible to reduce the signal noise components by means of the high resistance material layer.

Figure 12A:
FIGS. 12A to 12E are cross-sectional views respectively showing manufacturing steps of a single-layer wiring package substrate according to the second exemplary embodiment.
Figure 12B:
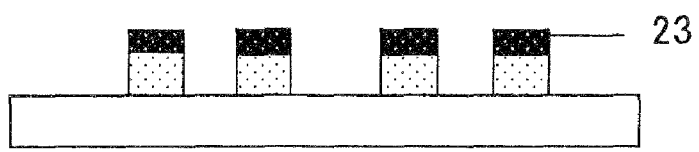
Figure 12C:
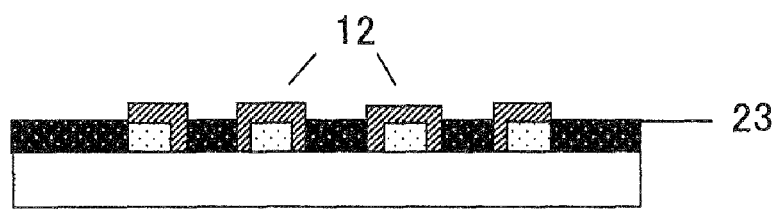
Figure 12D:
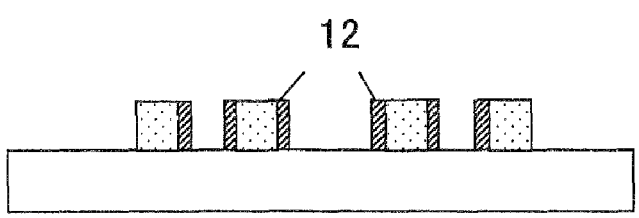
Figure 12E:
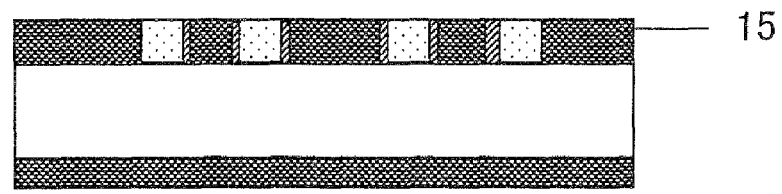

FIGS. 12A to 12E show manufacturing steps of the single-layer wiring package substrate as described above. In the first step, a copper foil 11 is bonded to a dielectric layer (e.g. of polyimide) 13 serving as a base material (FIG. 12A). A photoresist 23 is applied and the copper foil is etched to form wiring patterns (FIG. 12B). Patterns of photoresist 23 are formed such that the desired peripheries of the wiring patterns are not covered therewith, and a high resistance material layer 12 is formed by plating (FIG. 12C). The high-resistance material 12 is polished away from the top of the patterns (FIG. 12D). A solder resist 15 is applied to fill the gaps (FIG. 12E). Subsequently, lands 24 are patterned so that solder balls are formed thereon, and an opening is formed in the polyimide layer 13 in the bonding region 26 for the bonding purpose while leaving only bonding leads 25.

FIG. 13A is an enlarged plan view showing the part where the bonding region 26 is opened. FIG. 13B is an overall plan view of the package substrate. Each bonding lead 25 has a tapered portion in the vicinity of one edge of the opening. The bonding leads 25 are pressure bonded to bonding pads of a semiconductor chip at a central portion of the opening, while being cut off at their tapered portions by the impact applied thereto during the pressure bonding. The package substrate is fabricated in this manner. The subsequent packaging processes of the semiconductor device are the same as those illustrated in FIG. 6, and description thereof will be omitted.

FIG. 14 is a cross-sectional view of a semiconductor device manufactured by using the single-layer wiring package substrate. The signal line 18 shown here has a high resistance material layer 12 provided on the side faces thereof. A normal or predetermined resistance material layer 11, which is arranged behind the high resistance material layer 12 and is not seen in the figure, is indicated with parenthesis. The manufacturing steps of the single-layer wiring package substrate as illustrated in FIG. 12 and described above are only an example, and the single-layer wiring package substrate having a similar structure can be manufactured by other different steps. The wiring structures shown in FIGS. 9, 10 and 11 are applicable not only to the single-layer wiring package substrates but also to multi-layer wiring package substrates. The wiring structures shown in FIGS. 9, 10 and 11 are also usable for connection between the solder balls 17 and the bonding pads 16 of the semiconductor chip.

In the semiconductor device according to the second exemplary embodiment, each signal line on the package substrate has a double-layer structure consisting of the predetermined resistance material layer and the high resistance material layer. The high resistance material layer is provided on the side face of the signal line adjacent to the ground line. In addition, the high resistance material layer is provided on the mutually facing side faces of the adjacent differential signal lines. The high frequency noises can be reduced by providing the high resistance material layer on the side faces of the mutually facing lines to attenuate the high frequency components flowing due to the skin effect. The reduction of the high frequency noises makes it possible to provide a semiconductor device having a reduced size, an increased density, and increased operational speed.

Third Exemplary Embodiment

Figure 15:
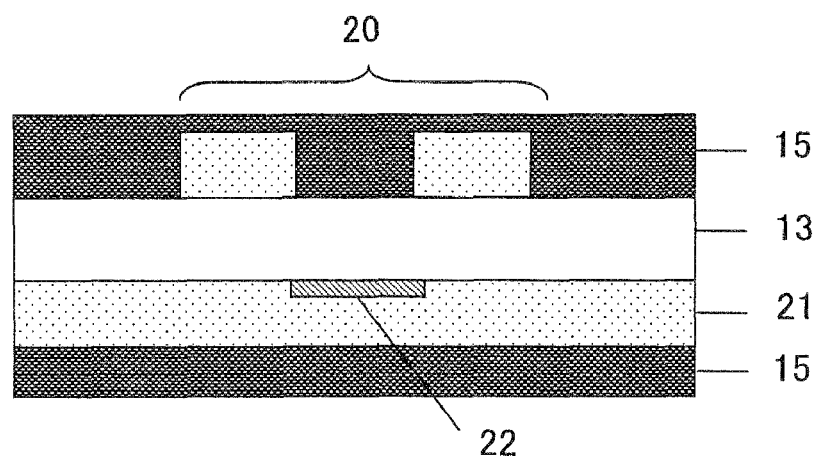
FIG. 15 is a cross-sectional view of a two-layer wiring package substrate according to a third exemplary embodiment.

A semiconductor device according to a third exemplary embodiment of the present invention will be described with reference to FIG. 15. The third exemplary embodiment relates to a semiconductor device mounted on a double-layer wiring package substrate and provided with differential signal lines. FIG. 15 is a cross-sectional view of a package substrate in which the ground plane located between the differential signal lines is formed by a high resistance material layer. In the third exemplary embodiment as well, the predetermined or normal resistance material layer 11 is formed of a low resistance material such as Cu, that is commonly used low-resistance wiring material The high resistance material layer 12 is formed of a metal material having a higher resistance than Cu, for example of Omega-Ply RCM (trade name of Ni—P alloy manufactured by Omega Technology Corp.) or 42 alloy.

In FIG. 15, the reference numeral 21 denotes the normal resistance material layer (Cu) forming the ground plane. The reference numeral 22 denotes the high resistance material layer also forming the ground plane. The reference numeral 15 denotes a solder resist, and 13 denotes a polyimide layer. When using the differential signal lines 20, return current flowing along the ground plane does not flow directly below the differential signal lines, but flows through a part of the ground plane close to and facing the region between the differential signal lines 20. In FIG. 15, this part corresponds to the vicinity of where the high resistance material layer 22 is arranged. Therefore, when using the differential signal lines, it is effective to arrange the high resistance material layer in the part of the ground plane close to and facing the region between the differential signal lines. Although not shown in the drawing, it is preferable to arrange a high resistance material layer on the outer peripheral plane of the differential signal lines facing the ground plane.

The semiconductor device according to the third exemplary embodiment has a double-layer wiring package substrate in which a high resistance material layer is arranged in a part of the ground plane close to and facing the region between the differential signal lines. According to the third exemplary embodiment, therefore, the high frequency noises are reduced by forming the high resistance material layer on the surface of the ground plane close to and facing the region between the differential signal lines to attenuate the high frequency components flowing due to the skin effect. The reduction of the high frequency noises makes it possible to provide a semiconductor device having a reduced size, an increased density, and increased operational speed.

The description above has been made while using the ground lines and the ground plane as the power supply wiring. In practice, however, power supply wiring consists of two types of wiring, high-voltage (VDD) lines and low-voltage ground (VSS) lines, and these high-voltage (VDD) and low-voltage (ground, VSS) lines exert equal effects on noises. Accordingly, the ground lines and the ground plane used in the exemplary embodiments above may be replaced with power supply lines and a power supply plane. This means that the present invention is effectively applicable to power supply wiring of high-voltage power supply lines or low-voltage power supply lines.

Although the present invention has been described in a certain degree of particularity based on its preferred exemplary embodiments, the present invention is not limited to these exemplary embodiments. It will be obvious that various changes and modifications may be made without departing from the scope of the invention, and these changes and modifications also fall within the scope of the present invention. For example, the present invention is applicable not only to a substrate having a lead-type bonding portion but also to a secondary lead of a wire-bonding type substrate.

What is claimed is:

1. A semiconductor device mounted on a package substrate, the package substrate comprising:
   a dielectric layer;
   a power supply line and a signal line both of which are formed on the dielectric layer by a predetermined resistance material layer; and
   a high resistance material layer which is provided selectively on the surface of the predetermined resistance material layer of the peripheral face of the signal line closest to the power supply line, at least one other surface of the predetermined resistance material layer being free of said high resistance material layer,
   wherein the high resistance material layer has a high resistance as compared with the predetermined resistance material layer.

2. The semiconductor device according to claim 1, wherein:
   the package substrate further comprises a bonding lead and an external terminal;
   a part of the dielectric layer is opened to provide a bonding region; and
   the bonding lead exposed is connected to a bonding pad of a semiconductor chip, and is further connected to the external terminal via wiring within the package substrate.

3. The semiconductor device according to claim 2, wherein when the power supply line and the signal line are formed by a metal wiring layer placed on the same layer, the high resistance material layer is formed on the adjacent and mutually facing side faces of the signal line and the power supply line.

4. The semiconductor device according to claim 2 wherein when the power supply line is formed by a metal wiring layer placed on a power-supply plane different from a plane of a wiring layer of the signal line, the high resistance material layer is formed on the surface of the signal line adjacent to and facing the power supply plane.

5. The semiconductor device according to claim 2, wherein when the power supply line and the signal line are formed by a metal wiring layer placed on the same layer and differential signal lines are arranged adjacent to each other as the signal line, the high resistance material layer is further provided on the adjacent and mutually facing side faces of the adjacent differential signal lines.

6. The semiconductor device according to claim 2, wherein when the power supply line is formed by a metal wiring layer placed on a power-supply plane different from a plane of a wiring layer of the signal line and differential signal lines are arranged adjacent to each other as the signal line, the high resistance material layer is provided on a surface region of the power supply plane facing the interval between the adjacent differential signal lines.

7. The semiconductor device according to claim 2, wherein the bonding lead has a tapered portion that is cut off by impact force applied during bonding thereof.

8. The semiconductor device according to claim 2, wherein the opened bonding region is sealed with a resin after the bonding.

9. The semiconductor device according to claim 2, wherein the predetermined resistance material layer is formed of copper and the high resistance material layer is formed of a metal having a higher resistance than copper.

10. The semiconductor device according to claim 2, wherein the high resistance material layer contains either 42 Alloy or Ni—P alloy.

11. The semiconductor device according to claim 2, wherein the dielectric layer is formed of polyimide.

12. The semiconductor device according to claim 2, wherein the external terminal is formed by a solder ball.

13. The semiconductor device according to claim 2, wherein the power supply line is a high-voltage power supply line or a low-voltage power supply line.

* * * * *

UNITED STATES PATENT AND TRADEMARK OFFICE
CERTIFICATE OF CORRECTION

PATENT NO. : 7,944,026 B2
APPLICATION NO. : 11/962142
DATED : May 17, 2011
INVENTOR(S) : Kazutaka Koshiishi et al.

Page 1 of 1

It is certified that error appears in the above-identified patent and that said Letters Patent is hereby corrected as shown below:

On the title page item "(73) Assignee: Elpida Memory, Inc., Tokyo (JP)"

should be changed to

--(73) Assignees: Elpida Memory, Inc., Tokyo (JP)
                     Hitachi, Ltd., Chiyoda-ku (JP)--

Signed and Sealed this
Twenty-eighth Day of May, 2013

Teresa Stanek Rea
*Acting Director of the United States Patent and Trademark Office*